(12) United States Patent
Chiang

(10) Patent No.: US 12,506,033 B2
(45) Date of Patent: Dec. 23, 2025

(54) METHOD OF MANUFACTURING SEMICONDUCTOR DEVICE

(71) Applicant: NANYA TECHNOLOGY CORPORATION, New Taipei (TW)

(72) Inventor: Chia Che Chiang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 596 days.

(21) Appl. No.: 17/937,464

(22) Filed: Oct. 3, 2022

(65) Prior Publication Data

US 2024/0112950 A1   Apr. 4, 2024

(51) Int. Cl.
  *H01L 21/768*   (2006.01)
  *H01L 21/02*   (2006.01)
  *H01L 21/033*   (2006.01)
  *H01L 21/762*   (2006.01)

(52) U.S. Cl.
  CPC .... *H01L 21/76832* (2013.01); *H01L 21/0228* (2013.01); *H01L 21/02458* (2013.01); *H01L 21/0337* (2013.01); *H01L 21/76224* (2013.01); *H01L 21/76834* (2013.01)

(58) Field of Classification Search
  CPC ......... H01L 21/76832; H01L 21/31144; H01L 23/642; H01L 21/0337; H10B 12/033
  See application file for complete search history.

(56) References Cited

U.S. PATENT DOCUMENTS

| | | | |
|---|---|---|---|
| 8,637,363 B1 * | 1/2014 | Jung | H01L 21/0337 438/238 |
| 9,570,304 B2 * | 2/2017 | Park | H01L 21/31144 |
| 10,256,140 B2 * | 4/2019 | Mohanty | H01L 21/0332 |
| 10,431,492 B1 * | 10/2019 | Shih | H01L 21/02222 |
| 11,289,366 B1 * | 3/2022 | Chuang | H01L 21/0337 |
| 12,218,004 B2 * | 2/2025 | Zuopeng | H01L 21/0338 |
| 2010/0065531 A1 * | 3/2010 | Kiehlbauch | H10D 89/10 216/41 |
| 2010/0248436 A1 * | 9/2010 | Lee | H10D 1/716 430/323 |
| 2011/0039413 A1 * | 2/2011 | Akinmade-Yusuff | H01L 21/0335 438/700 |
| 2013/0034948 A1 * | 2/2013 | Huang | H01L 21/31053 257/E21.546 |
| 2013/0295755 A1 * | 11/2013 | Chang | H01L 21/76816 438/586 |
| 2016/0314983 A1 * | 10/2016 | Han | H10D 84/038 |
| 2017/0053802 A1 * | 2/2017 | Park | H01L 21/32139 |

(Continued)

FOREIGN PATENT DOCUMENTS

| | | | |
|---|---|---|---|
| TW | 200516665 A | | 5/2005 |
| TW | I779940 B | | 10/2022 |

*Primary Examiner* — Bac H Au
(74) *Attorney, Agent, or Firm* — CKC & Partners Co., LLC

(57) ABSTRACT

The present disclosure provides a method of manufacturing a semiconductor device. The method includes: forming a semiconductor layer stack on a metal layer, in which the semiconductor layer stack includes a first nitride layer, a first oxide layer, a second nitride layer, a second oxide layer, and a third nitride layer; forming a mask layer on the semiconductor layer stack, in which the mask layer includes a plurality of hollowed portions; depositing a thin silicon layer on inner walls of the hollowed portions; and forming a plurality of trenches in the semiconductor layer stack by the hollowed portions.

18 Claims, 5 Drawing Sheets

(56) References Cited

U.S. PATENT DOCUMENTS

| | | | |
|---|---|---|---|
| 2018/0226251 A1* | 8/2018 | Chen | H01L 21/0273 |
| 2019/0027376 A1* | 1/2019 | Yoon | G03F 1/26 |
| 2019/0067022 A1* | 2/2019 | Lin | H01L 21/31138 |
| 2019/0067096 A1* | 2/2019 | Huang | H01L 21/76841 |
| 2020/0020576 A1* | 1/2020 | Chang | H01L 21/47 |
| 2020/0075405 A1* | 3/2020 | Huang | H01L 21/0337 |
| 2020/0111684 A1* | 4/2020 | Choi | H01L 21/31144 |
| 2021/0134810 A1* | 5/2021 | Lin | H10D 1/716 |
| 2022/0085030 A1* | 3/2022 | Wan | H10B 12/033 |
| 2023/0151159 A1* | 5/2023 | Naoki | H01L 21/0271 |
| | | | 438/530 |
| 2023/0411166 A1* | 12/2023 | Zeng | H01L 21/32055 |

* cited by examiner

M

```
┌─────────────────────────────────────────────────────────┐
│ forming a semiconductor layer stack, in which the       │
│ semiconductor layer stack includes a first nitride      │──S101
│ layer, a first oxide layer, a second nitride layer,     │
│ a second oxide layer, and a third nitride layer         │
└─────────────────────────────────────────────────────────┘
                            │
                            ▼
┌─────────────────────────────────────────────────────────┐
│ forming a mask layer on the semiconductor layer stack,  │──S102
│ wherein the mask layer includes a plurality of hollowed │
│ portions                                                │
└─────────────────────────────────────────────────────────┘
                            │
                            ▼
┌─────────────────────────────────────────────────────────┐
│ depositing a thin silicon layer on inner walls of the   │──S103
│ hollowed portions                                       │
└─────────────────────────────────────────────────────────┘
                            │
                            ▼
┌─────────────────────────────────────────────────────────┐
│ forming a plurality of trenches in the semiconductor    │──S104
│ layer stack by the hollowed portions                    │
└─────────────────────────────────────────────────────────┘
```

Fig. 1

METHOD OF MANUFACTURING SEMICONDUCTOR DEVICE

BACKGROUND

Field of Invention

The present invention relates to a method of manufacturing a semiconductor device.

Description of Related Art

Semiconductor industries are developing and improving the manufacturing process for semiconductor structures, while the miniaturization of components continues. The accuracy of the scale and shape of the capacitor container structure required to increase its capacitance has thus become more important. For instance, container process define container structure by dry etching process to open a top silicon nitride ($Si_xN_y$) layer, a top oxide layer, a middle silicon nitride ($Si_xN_y$) layer, and a bottom oxide layer and stop on a bottom silicon nitride ($Si_xN_y$) layer.

Larger containers (i.e., larger critical dimension of trenches opened by dry etching process) can get higher capacitor value. However, a larger container more easily causes container problems such as a short (for example, electrical leakage). The semiconductor industry commonly utilizes additional polymer produced from the dry etching process to maintain the critical dimension of the trenches, but the subsequent wet etching process performed to remove the polymer may broaden the critical dimension of the trenches.

Therefore, the critical dimensions of a container should be appropriately decreased when a container short problem has the likelihood of occurrence.

SUMMARY

In view of this, one purpose of present disclosure is to provide a method of manufacturing a semiconductor device that can solve the aforementioned problems.

In order to achieve the above objective, according to an embodiment of the present disclosure, a method of manufacturing a semiconductor device includes: forming a semiconductor layer stack on a metal layer, in which the semiconductor layer stack includes a first nitride layer, a first oxide layer, a second nitride layer, a second oxide layer, and a third nitride layer; forming a mask layer on the semiconductor layer stack, in which the mask layer includes a plurality of hollowed portions; depositing a thin silicon layer on inner walls of the hollowed portions; and forming a plurality of trenches in the semiconductor layer stack by the hollowed portions.

In one or more embodiments of the present disclosure, forming the trenches in the semiconductor layer stack by the hollowed portions allows the trenches to communicate to the first nitride layer.

In one or more embodiments of the present disclosure, forming the trenches in the semiconductor layer stack by the hollowed portions is performed by an etching process.

In one or more embodiments of the present disclosure, each of the trenches includes a width in a range from 15 nm to 20 nm.

In one or more embodiments of the present disclosure, the metal layer comprises tungsten.

In one or more embodiments of the present disclosure, the second nitride layer is disposed over the first nitride layer, the third nitride layer is disposed over the second nitride layer, the first oxide layer is disposed between the first nitride layer and the second nitride layer, and the second oxide layer is disposed between the second nitride layer and the third nitride layer.

In one or more embodiments of the present disclosure, depositing the thin silicon layer is performed by a blanket depositing process.

In one or more embodiments of the present disclosure, the thin silicon layer comprises monocrystalline.

In one or more embodiments of the present disclosure, depositing the thin silicon layer is performed through an atomic layer deposition process.

In one or more embodiments of the present disclosure, depositing the thin silicon layer is performed before forming the trenches in the semiconductor layer stack by the hollowed portions.

In order to achieve the above objective, according to an embodiment of the present disclosure, a method of manufacturing a semiconductor device includes: forming a semiconductor layer stack, in which the semiconductor layer stack includes a first nitride layer, a first oxide layer, a second nitride layer, a second oxide layer, and a third nitride layer; forming a mask layer on the semiconductor layer stack, in which the mask layer includes a plurality of hollowed portions; depositing a thin silicon layer on inner walls of the hollowed portions; and forming a plurality of trenches in the semiconductor layer stack by the hollowed portions, in which the trenches communicate to the first nitride layer.

In one or more embodiments of the present disclosure, a method of manufacturing a semiconductor device further includes forming a metal layer performed before forming the semiconductor layer stack, and the semiconductor layer stack is formed on the metal layer.

In one or more embodiments of the present disclosure, the metal layer comprises tungsten.

In one or more embodiments of the present disclosure, forming the trenches in the semiconductor layer stack by the hollowed portions is performed by an etching process.

In one or more embodiments of the present disclosure, each of the trenches includes a width in a range from 15 nm to 20 nm.

In one or more embodiments of the present disclosure, the second nitride layer is disposed over the first nitride layer, the third nitride layer is disposed over the second nitride layer, the first oxide layer is disposed between the first nitride layer and the second nitride layer, and the second oxide layer is disposed between the second nitride layer and the third nitride layer.

In one or more embodiments of the present disclosure, depositing the thin silicon layer is performed by a blanket depositing process.

In one or more embodiments of the present disclosure, the thin silicon layer comprises monocrystalline.

In one or more embodiments of the present disclosure, depositing the thin silicon layer is performed through an atomic layer deposition process.

In one or more embodiments of the present disclosure, depositing the thin silicon layer is performed before forming the trenches in the semiconductor layer stack by the hollowed portions.

In summary, in the method of manufacturing the semiconductor device of the present disclosure, since the mask layer includes the hollowed portions, such that the hollowed portions define the critical dimension of the trenches. In the method of manufacturing the semiconductor device of the present disclosure, since the thin silicon layer is deposited on inner walls of the hollowed portions, the critical dimension of trenches may be shrunk. In the method of manufacturing the semiconductor device of the present disclosure, since depositing the thin silicon layer is performed before forming the trenches in the semiconductor layer stack, the container with satisfying critical dimension may be obtained. The method of manufacturing the semiconductor device solves the container short problem by shrinking the critical dimension of the container, thereby improving its electrical performance.

It is to be understood that both the foregoing general description and the following detailed description are by examples, and are intended to provide further explanation of the disclosure as claimed.

BRIEF DESCRIPTION OF THE DRAWINGS

The invention can be more fully understood by reading the following detailed description of the embodiment, with reference made to the accompanying drawings as follows:

FIG. 1 is a flow chart of a method of manufacturing a semiconductor device in accordance with an embodiment of present disclosure;

DETAILED DESCRIPTION

Figure 2:
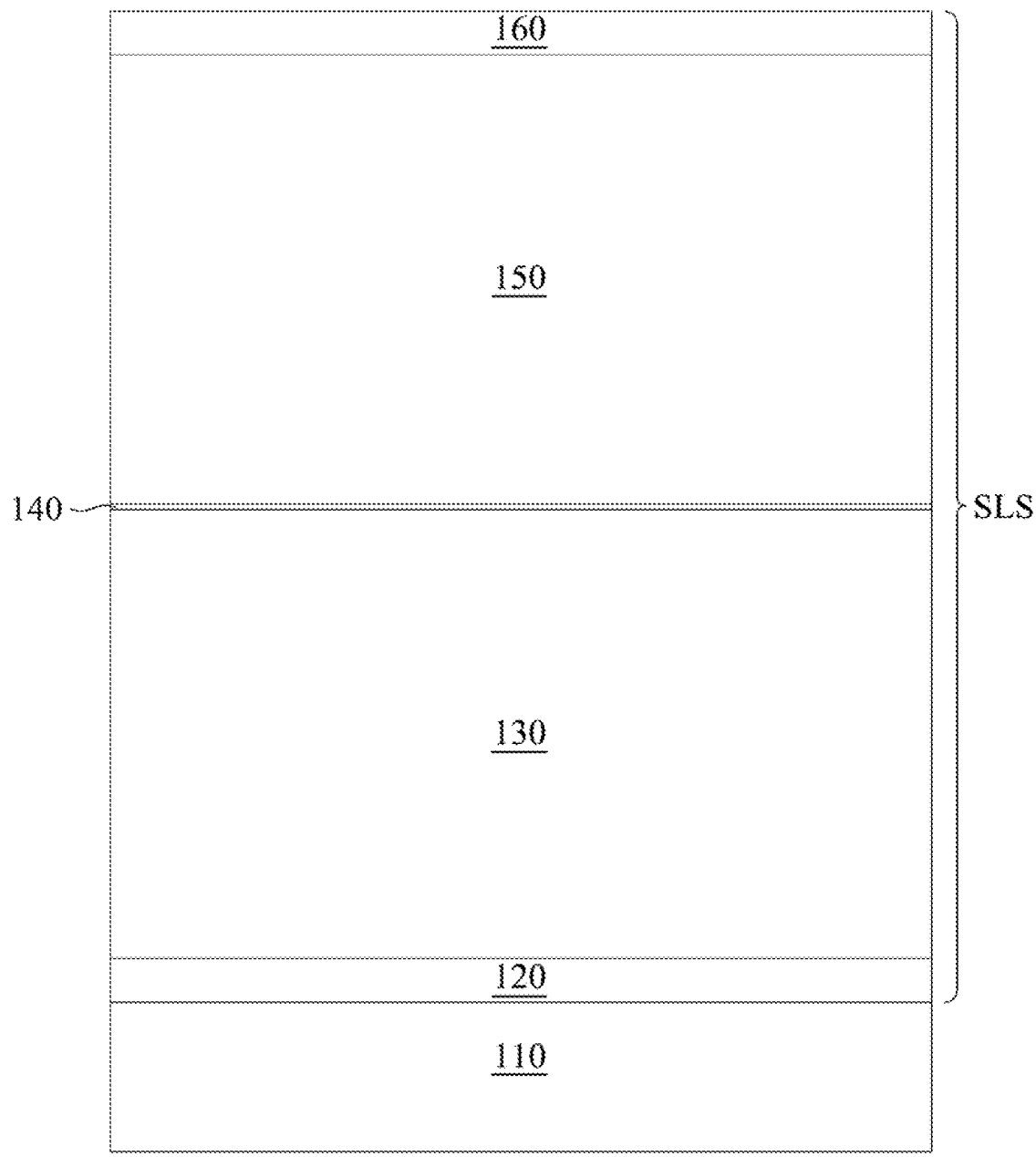
FIG. 2 is a schematic view of an intermediate stage of manufacturing a semiconductor device in accordance with an embodiment of present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1. FIG. 1 is a flow chart of a method M of manufacturing a semiconductor device 100 shown in FIG. 5 in accordance with an embodiment of present disclosure. The method M shown in FIG. 1 includes step S101, step S102, step S103, and step S104. Please refer to FIG. 1 and FIG. 2 for better understanding step S101, refer to FIG. 1 and FIG. 3 for better understanding step S102, refer to FIG. 1 and FIG. 4 for better understanding step S103, and refer to FIG. 1 and FIG. 5 for better understanding step S104.

Step S101, step S102, step S103, and step S104 are described in detail below.

In step S101, a semiconductor layer stack is formed.

Reference is made to FIG. 2. FIG. 2 is a schematic view of an intermediate stage of manufacturing a semiconductor device 100 in accordance with an embodiment of present disclosure. As shown in FIG. 2, a metal layer 110 is provided. A semiconductor layer stack SLS is formed on the metal layer 110. In this embodiment, the semiconductor layer stack SLS includes a first nitride layer 120, a first oxide layer 130, a second nitride layer 140, a second oxide layer 150, and a third nitride layer 160, as shown in FIG. 2. The first nitride layer 120 is formed over the metal layer 110. The first oxide layer 130 is formed over the first nitride layer 120. The second nitride layer 140 is formed over the first oxide layer 130. The second oxide layer 150 is formed over the second nitride layer 140. The third nitride layer 160 is formed over the second oxide layer 150.

In some embodiments, the metal layer 110 may include a conductive material, such as tungsten. However, any suitable material may be utilized. In some embodiments, the metal layer 110 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the metal layer 110.

In some embodiments, the first nitride layer 120 may include a nitride material, such as silicon nitride ($Si_xN_y$). However, any suitable nitride material may be utilized.

In some embodiments, the first nitride layer 120 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the first nitride layer 120.

In some embodiments, the trenches T may be formed by performing an etch process, such as dry etch. The present disclosure is not intended to limit the methods of forming the trenches T.

In some embodiments, the first oxide layer 130 may include an oxide material, such as silicon oxide or borophosphosilicate glass (BPSG). However, any suitable material may be utilized.

In some embodiments, the first oxide layer 130 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the first oxide layer 130.

In some embodiments, the second nitride layer 140 may include a nitride material, such as silicon nitride ($Si_xN_y$). However, any suitable material may be utilized.

In some embodiments, the second nitride layer 140 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the second nitride layer 140.

In some embodiments, the second oxide layer 150 may include an oxide material, such as silicon oxide or silicon oxynitride. However, any suitable material may be utilized.

In some embodiments, the second oxide layer 150 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the second oxide layer 150.

In some embodiments, the third nitride layer 160 may include a nitride material, such as silicon nitride ($Si_xN_y$). However, any suitable material may be utilized.

In some embodiments, the third nitride layer 160 may be formed by any suitable method, for example, CVD (chemical vapor deposition) process, PECVD (plasma-enhanced chemical vapor deposition) process, PVD (physical vapor deposition) process, ALD (atomic layer deposition) process, PEALD (plasma-enhanced atomic layer deposition) process, ECP (electrochemical plating) process, electroless plating process, or the like. The present disclosure is not intended to limit the methods of forming the third nitride layer 160.

In some embodiments, the first oxide layer 130 is formed between the first nitride layer 120 and the second nitride layer 140, and the second oxide layer 150 is formed between the second nitride layer 140 and the third nitride layer 160, as shown in FIG. 2.

In step S102, a mask layer is formed on the semiconductor layer stack, in which the mask layer includes a plurality of hollowed portions.

Figure 3:
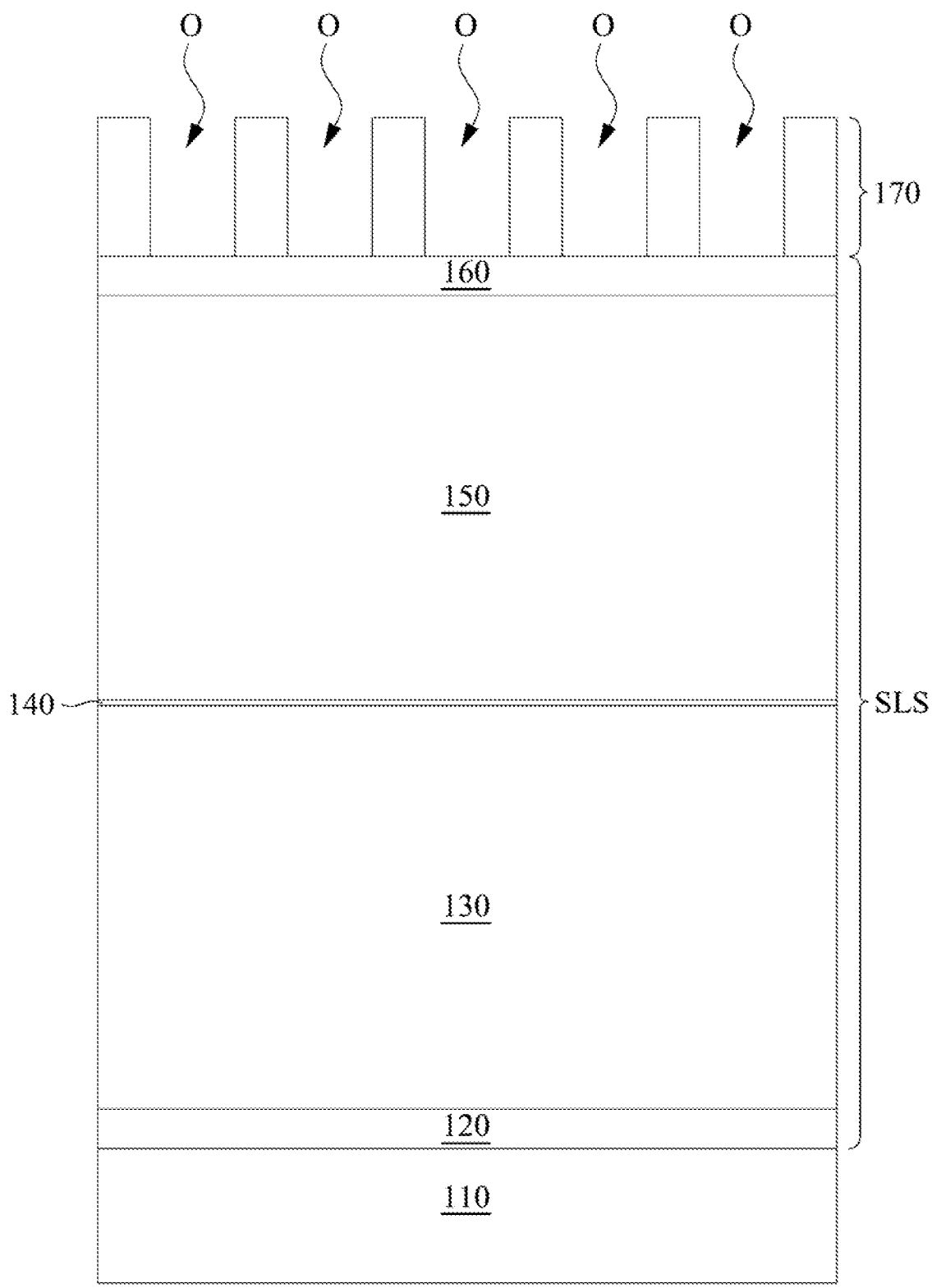
FIG. 3 is a schematic view of an intermediate stage of manufacturing a semiconductor device in accordance with an embodiment of present disclosure.

Reference is made to FIG. 3. As shown in FIG. 3, a mask layer 170 is formed on the semiconductor layer stack SLS. In some embodiments, as shown in FIG. 3, the mask layer 170 is formed on the third nitride layer 160, but the present disclosure is not limited thereto.

In some embodiments, as shown in FIG. 3, the mask layer 170 includes hollowed portions O. In some embodiments, the mask layer 170 is a patterned mask. In some embodiments, the hollowed portions O run through the mask layer 170.

In some embodiments, the mask layer 170 may include a material, such as polysilicon. However, any suitable material may be utilized.

In some embodiments, the mask layer 170 may be formed by any suitable method, for example, a photolithography process, or the like. The present disclosure is not intended to limit the methods of forming the mask layer 170.

In some embodiments, each of the hollowed portions O includes a width, and the width of each of the hollowed portions O is in a range from about 20 nm to about 30 nm, but the present disclosure is not intended to limit the size of the hollowed portions O.

In some embodiments, each of the hollowed portions O includes a width, and the width of each of the hollowed portions O is about 23.3 nm, but the present disclosure is not intended to limit the size of the hollowed portions O.

In step S103, a thin silicon layer is deposited on inner walls of the hollowed portions.

Figure 4:
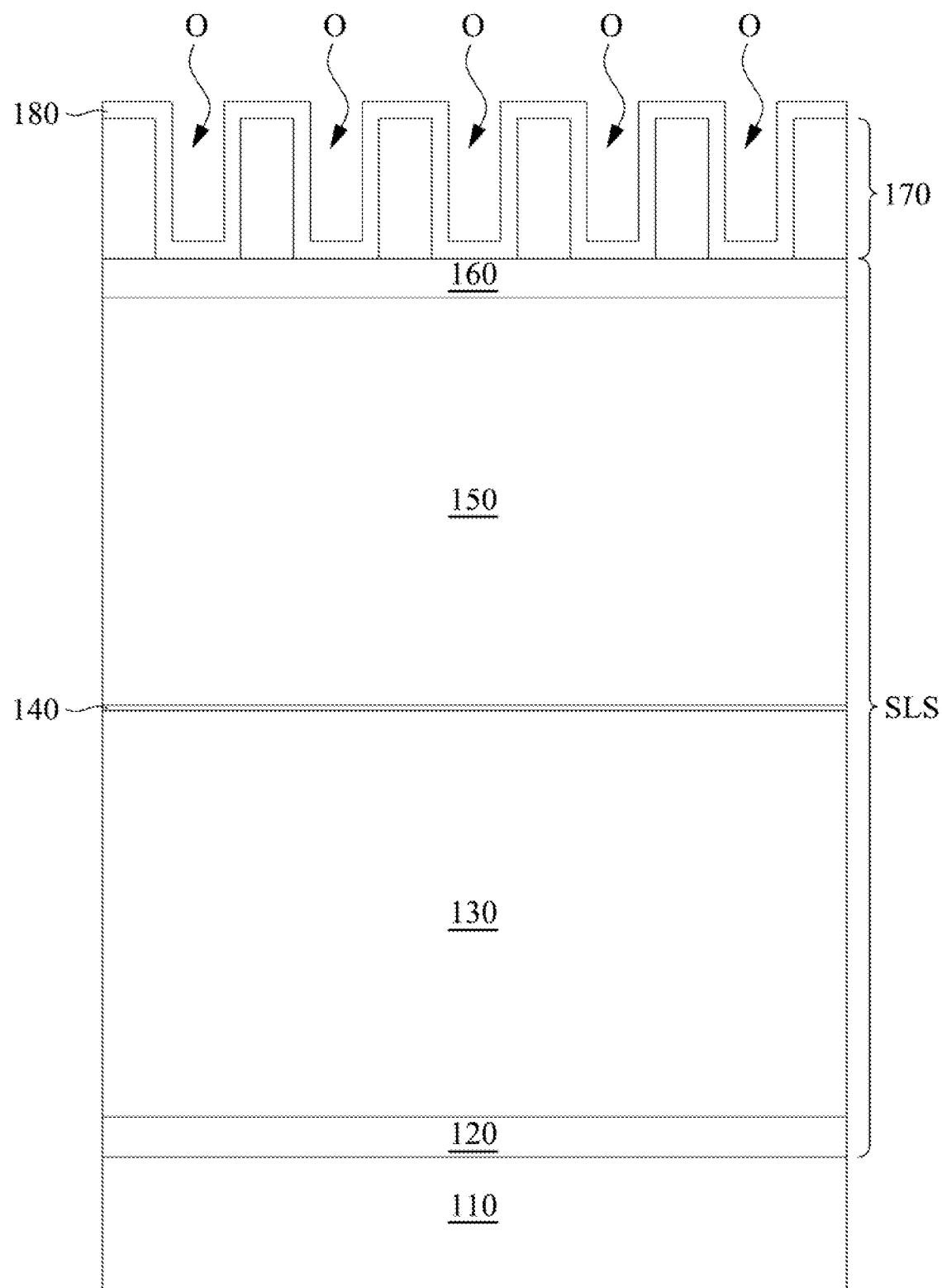
FIG. 4 is a schematic view of an intermediate stage of manufacturing the semiconductor device in accordance with an embodiment of present disclosure.

Reference is made to FIG. 4. As shown in FIG. 4, a thin silicon layer 180 is formed over the third nitride layer 160 and the mask layer 170. More specifically, the thin silicon layer 180 is formed on inner walls of the hollowed portions O. In some embodiments, the thin silicon layer 180 is deposited on an upper surface of the mask layer 170 and a portion of a top surface of the third nitride layer 160.

In some embodiments, the thin silicon layer 180 may include a material, such as monocrystalline silicon, oxide, and polysilicon. However, any suitable material may be utilized.

In some embodiments, the thin silicon layer 180 may be formed by any suitable deposition method, for example, ALD (atomic layer deposition) process, or the like. The present disclosure is not intended to limit the methods of forming the thin silicon layer 180. The thin silicon layer 180 deposited by using ALD (atomic layer deposition) process comes with better step coverage and excellent thickness control.

In some embodiments, the thin silicon layer 180 may be formed by any suitable deposition method, for example, isotropic deposition process, or the like. The present disclosure is not intended to limit the methods of forming the thin silicon layer 180. The thin silicon layer 180 deposited by using isotropic deposition process comes with better step coverage and excellent thickness control.

In some embodiments, the thin silicon layer 180 may be formed by any suitable deposition method, for example, blanket deposition process, or the like. The present disclosure is not intended to limit the methods of forming the thin silicon layer 180. The thin silicon layer 180 deposited by using blanket deposition process comes with better step coverage and excellent thickness control.

In some embodiments, thin silicon layer 180 includes a thickness, and the thickness of the thin silicon layer 180 is in a range about 5 nm to about 10 nm, but the present disclosure is not intended to limit the size of the thin silicon layer 180.

In some embodiments, the thin silicon layer 180 includes a thickness, and the thickness of the thin silicon layer 180 is about 7.5 nm, but the present disclosure is not intended to limit the size of the thin silicon layer 180.

In step S104, a plurality of trenches are formed in the semiconductor layer stack by the hollowed portions.

Figure 5:
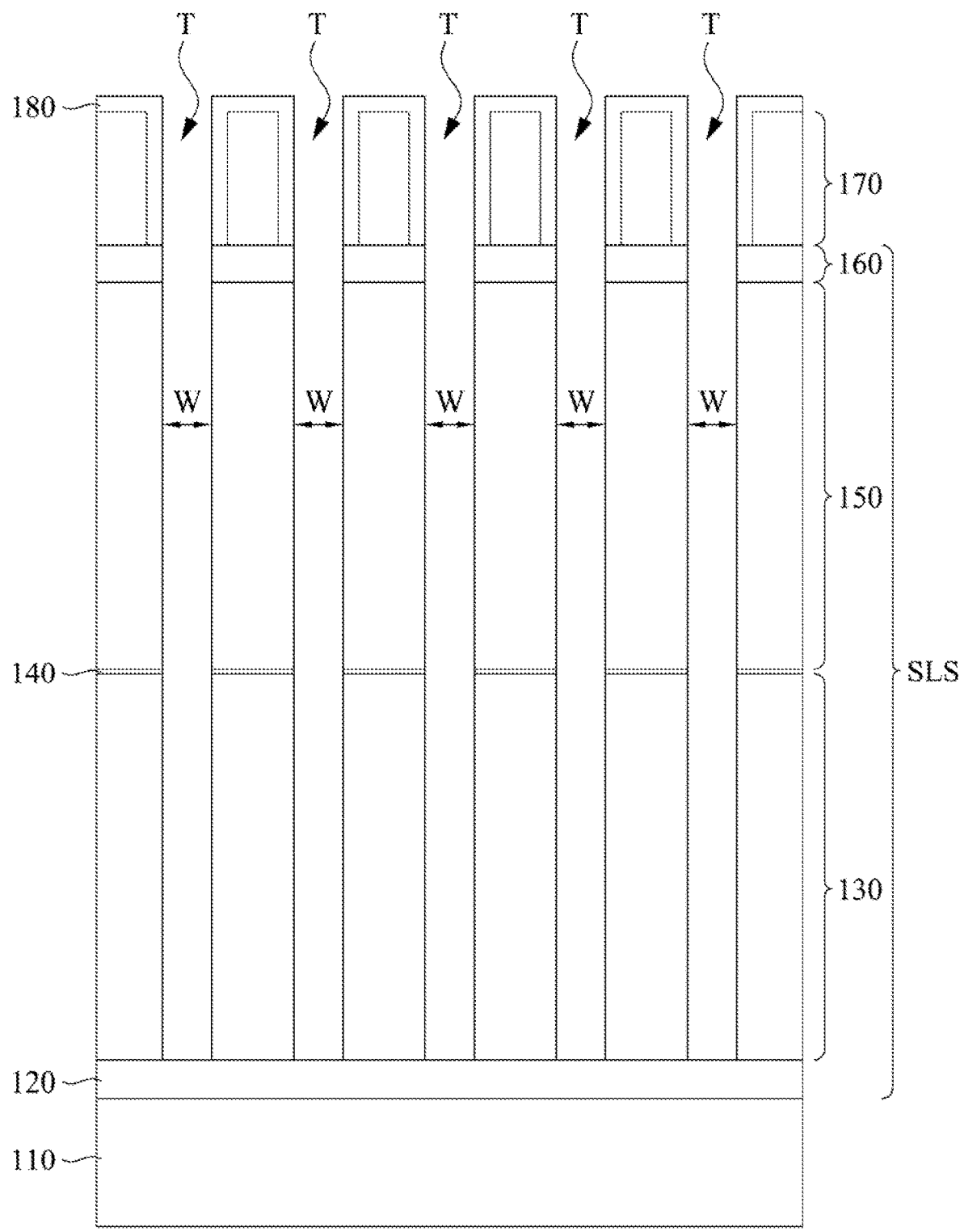
FIG. 5 is a schematic view of an intermediate stage of manufacturing the semiconductor device in accordance with an embodiment of present disclosure.

Reference is made to FIG. 5. As shown in FIG. 5, a plurality of trenches T are formed in the semiconductor layer stack SLS by the hollowed portions O, thereby forming the semiconductor device 100. More specifically, the trenches T run through a portion of the thin silicon layer 180, the third nitride layer 160, the second oxide layer 150, the second nitride layer 140, and the first oxide layer 130 in the semiconductor layer stack SLS. In this embodiment, the trenches T formed in the semiconductor layer stack SLS by the hollowed portions O communicate the first nitride layer 120.

In step S104, as shown in FIG. 5, the trenches T are formed in the semiconductor layer stack SLS by hollowed portions O using an etching method, such that each of the trenches T includes a width W. In this embodiment, the widths W in each of the trenches T are substantially the same.

In some embodiments, the trenches T may be formed by, for example, dry etching or the like. The present disclosure is not intended to limit the methods of forming the trenches T.

In some embodiments, the trenches T may be formed by, for example, anisotropic etching or the like. The present disclosure is not intended to limit the methods of forming the trenches T.

In some embodiments, a width of each of the trenches T is in a range from about 15 nm to 20 nm, but the present disclosure is not intended to limit the size of the trenches T.

In some embodiments, the width W of the trenches T is less than the width of the hollowed portions O (i.e., a width of the hollowed portion O).

In some embodiments, the width W of the trenches T may remain constant at different heights. The present disclosure is not intended to limit the shape of the trenches T.

In some embodiments, depositing the thin silicon layer 180 on inner walls of the hollowed portions O in step S103 is performed before forming the trenches T in the semiconductor layer stack SLS by the hollowed portions O, such that the critical dimension of the mask layer 170 and the width W of the trenches T may be shrunk then obtain the container with satisfying critical dimension.

By performing the method M including step S101, step S102, step S103, and step S104, the semiconductor device 100 with better electrical performance may be manufactured.

Based on the above discussions, it can be seen that the method M of manufacturing the semiconductor device 100 of the present disclosure offers advantages. It is understood, however, that other embodiments may offer additional advantages, and not all advantages are necessarily disclosed herein, and that no particular advantages are required for all embodiments.

From the above detailed description of the specific embodiments of the present disclosure, it can be clearly seen that in the method of manufacturing the semiconductor device of the present disclosure, since the mask layer includes the hollowed portions, such that the hollowed portions define the critical dimension of the trenches. In the method of manufacturing the semiconductor device of the present disclosure, since the thin silicon layer is deposited on inner walls of the hollowed portions, the critical dimension of trenches may be shrunk. In the method of manufacturing the semiconductor device of the present disclosure, since depositing the thin silicon layer is performed before forming the trenches in the semiconductor layer stack, the container with satisfying critical dimension may be obtained. In the embodiments of the present disclosure, the method of manufacturing the semiconductor device solves the container short problem by shrinking the critical dimension of the container, thereby improving its electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A method of manufacturing a semiconductor device, comprising:
   forming a semiconductor layer stack on a metal layer, wherein the semiconductor layer stack comprises a first nitride layer, a first oxide layer, a second nitride layer, a second oxide layer, and a third nitride layer;
   forming a mask layer on the semiconductor layer stack, wherein the mask layer includes a plurality of hollowed portions;
   depositing a thin silicon layer entirely covering inner walls of the hollowed portions and upper surfaces of the mask layer by a blanket depositing process; and
   forming a plurality of trenches through an entirety of the semiconductor layer stack by the hollowed portions of the mask layer, wherein the thin silicon layer remains on side surfaces and the upper surfaces of the mask layer after the trenches are formed.

2. The method of claim 1, wherein forming the trenches in the semiconductor layer stack by the hollowed portions allows the trenches to communicate to the first nitride layer.

3. The method of claim 1, wherein forming the trenches in the semiconductor layer stack by the hollowed portions is performed by an etching process.

4. The method of claim 1, wherein each of the trenches includes a width in a range from 15 nm to 20 nm.

5. The method of claim 1, wherein the metal layer comprises tungsten.

6. The method of claim 1, wherein the second nitride layer is disposed over the first nitride layer, the third nitride layer is disposed over the second nitride layer, the first oxide layer is disposed between the first nitride layer and the second nitride layer, and the second oxide layer is disposed between the second nitride layer and the third nitride layer.

7. The method of claim 1, wherein the thin silicon layer comprises monocrystalline.

8. The method of claim 1, wherein depositing the thin silicon layer is performed through an atomic layer deposition process.

9. The method of claim 1, wherein depositing the thin silicon layer is performed before forming the trenches in the semiconductor layer stack by the hollowed portions.

10. A method of manufacturing a semiconductor device, comprising:
    forming a semiconductor layer stack, wherein the semiconductor layer stack comprises a first nitride layer, a first oxide layer, a second nitride layer, a second oxide layer, and a third nitride layer;
    forming a mask layer on the semiconductor layer stack, wherein the mask layer includes a plurality of hollowed portions;
    depositing a thin silicon layer entirely covering inner walls of the hollowed portions and upper surfaces of the mask layer by a blanket depositing process; and
    forming a plurality of trenches through an entirety of the semiconductor layer stack by the hollowed portions of the mask layer, wherein the trenches communicate to the first nitride layer, wherein the thin silicon layer remains on side surfaces and the upper surfaces of the mask layer after the trenches are formed.

11. The method of claim 10, further comprising forming a metal layer performed before forming the semiconductor layer stack, and the semiconductor layer stack is formed on the metal layer.

12. The method of claim 11, wherein the metal layer comprises tungsten.

13. The method of claim 10, wherein forming the trenches in the semiconductor layer stack by the hollowed portions is performed by an etching process.

14. The method of claim 10, wherein each of the trenches includes a width in a range from 15 nm to 20 nm.

15. The method of claim 10, wherein the second nitride layer is disposed over the first nitride layer, the third nitride layer is disposed over the second nitride layer, the first oxide layer is disposed between the first nitride layer and the second nitride layer, and the second oxide layer is disposed between the second nitride layer and the third nitride layer.

16. The method of claim 10, wherein the thin silicon layer comprises monocrystalline.

17. The method of claim 10, wherein depositing the thin silicon layer is performed through an atomic layer deposition process.

18. The method of claim 10, wherein depositing the thin silicon layer is performed before forming the trenches in the semiconductor layer stack by the hollowed portions.

* * * * *